United States Patent
Vaello Paños et al.

(10) Patent No.: US 12,155,171 B2
(45) Date of Patent: Nov. 26, 2024

(54) LIGHT EMITTING MODULE INCLUDING ENHANCED EYE-SAFETY FEATURE

(71) Applicant: ams International AG, Jona (CH)

(72) Inventors: Miguel Bruno Vaello Paños, Zurich (CH); David Stoppa, Eindhoven (NL); Manfred Lueger, Eindhoven (NL); Thomas Jessenig, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 744 days.

(21) Appl. No.: 17/414,844

(22) PCT Filed: Dec. 13, 2019

(86) PCT No.: PCT/EP2019/085172
§ 371 (c)(1),
(2) Date: Jun. 16, 2021

(87) PCT Pub. No.: WO2020/126936
PCT Pub. Date: Jun. 25, 2020

(65) Prior Publication Data
US 2022/0069542 A1 Mar. 3, 2022

Related U.S. Application Data

(60) Provisional application No. 62/780,510, filed on Dec. 17, 2018.

(51) Int. Cl.
*H01S 3/00* (2006.01)
*H01S 5/02257* (2021.01)
(Continued)

(52) U.S. Cl.
CPC ........ *H01S 5/02257* (2021.01); *H01S 5/0264* (2013.01); *H01S 5/0612* (2013.01);
(Continued)

(58) Field of Classification Search
CPC .. H01S 5/02257; H01S 5/0264; H01S 5/0612; H01S 5/06825; H01S 5/02208; H01S 5/02325; H01S 5/042; H01S 5/0683
See application file for complete search history.

(56) References Cited

U.S. PATENT DOCUMENTS 6,587,481 B1    7/2003 Seong et al.
9,773,169 B1 *  9/2017 Fulmer ................ G06V 10/993
(Continued)

FOREIGN PATENT DOCUMENTS

CN    1273415 A    11/2000
CN    1595740 A    3/2005
(Continued)

OTHER PUBLICATIONS

Chinese office action issued for the corresponding Chinese patent application No. 201980083676.2, dated Feb. 21, 2024, 10 pages (for informational purposes only).

*Primary Examiner* — Kinam Park
(74) *Attorney, Agent, or Firm* — VIERING, JENTSCHURA & PARTNER mbB

(57) ABSTRACT

Illuminator modules having improved safety features are described. In some implementations, light to be emitted from a module is produced by a light source, and light reflected by an optical component disposed over the light source is detected by a photodetectors. A distribution of the reflected light detected by the photodetectors is monitored, and an optical output power of the light source is regulated if it is determined, based on the monitored distribution of light, that an unsafe level of light may be emitted from the module.

19 Claims, 4 Drawing Sheets

(51) Int. Cl.
*H01S 5/026* (2006.01)
*H01S 5/06* (2006.01)
*H01S 5/068* (2006.01)
*H01S 5/02208* (2021.01)
*H01S 5/02325* (2021.01)
*H01S 5/042* (2006.01)
*H01S 5/0683* (2006.01)

(52) U.S. Cl.
CPC ...... *H01S 5/06825* (2013.01); *H01S 5/02208* (2013.01); *H01S 5/02325* (2021.01); *H01S 5/042* (2013.01); *H01S 5/0683* (2013.01)

(56) References Cited

U.S. PATENT DOCUMENTS

| | | | |
|---|---|---|---|
| 10,222,474 B1 * | 3/2019 | Raring | G01S 17/89 |
| 2005/0084218 A1 | 4/2005 | Ide et al. | |
| 2006/0039434 A1 | 2/2006 | Coleman | |
| 2013/0330090 A1 * | 12/2013 | Obika | H01S 5/02257 |
| | | | 398/182 |
| 2016/0290584 A1 | 10/2016 | Nomura et al. | |
| 2016/0348865 A1 * | 12/2016 | Nakazawa | H01S 5/06808 |
| 2017/0267175 A1 | 9/2017 | Ichikawa | |
| 2018/0331492 A1 * | 11/2018 | Itoh | H01S 5/02255 |
| 2019/0137064 A1 * | 5/2019 | Zozgornik | F21K 9/64 |
| 2020/0052466 A1 * | 2/2020 | Chen | H01S 5/423 |
| 2020/0396813 A1 * | 12/2020 | Lueger | H03K 5/04 |

FOREIGN PATENT DOCUMENTS

| | | |
|---|---|---|
| CN | 1738117 A | 2/2006 |
| CN | 106051573 A | 10/2016 |
| CN | 207557634 U | 6/2018 |
| CN | 108767643 A | 11/2018 |
| CN | 108832475 A | 11/2018 |
| WO | 2016147759 A1 | 9/2016 |
| WO | 2017158004 A1 | 9/2017 |
| WO | 2017210078 A1 | 12/2017 |
| WO | 2018128904 A1 | 7/2018 |
| WO | 2018156412 A1 | 8/2018 |

* cited by examiner

LIGHT EMITTING MODULE INCLUDING ENHANCED EYE-SAFETY FEATURE

RELATED APPLICATIONS

The present invention is a U.S. National Stage under 35 USC 371 patent application, claiming priority to Serial No. PCT/EP2019/085172, filed on 13 Dec. 2019; which claims priority of U.S. Provisional Application Ser. No. 62/780,510, filed on 17 Dec. 2018, the entirety of both of which are incorporated herein by reference.

FIELD OF THE DISCLOSURE

This disclosure relates to light emitting modules that include an enhanced eye-safety feature.

BACKGROUND

New features are being added to smart phones, tablets and other portable computing devices that include technologies to record three dimensional images, sense motion and/or gestures. Digital recording methods use various types of miniature illuminators, which interact with cameras to record dynamical events in three dimensional regions. These illuminators can be of various forms and deliver different types of functions. Some illuminate a wide area with very short pulses for Light Detection and Ranging (LIDAR) type measurements recording time of flight information. Other illuminators are pulsed or continuous wave (CW), and project structured light patterns onto a scene. The digital camera records an image of the structured light pattern, and software algorithms are used to determine three-dimensional scene information from modifications in the patterned image.

Technologies that are suitable for miniature illuminators include high power vertical cavity surface emitting laser (VCSEL) devices, edge-emitting laser device, and arrays of such devices. These devices can be pulsed with very fast rise times suitable for time-of-flight applications. They are small, but produce high power laser beams with efficient electro-optic conversion. However, various optical components (e.g., an optical diffuser) can be placed in the beam path to modify the beam properties for the specific application.

The optical output power of a bare VCSEL typically can, in some cases, be so high that it may cause damage to a person's eye or skin in the event the quality of the optical component is compromised. Thus, it is important to ensure that the high power laser illuminators meet laser safety regulations when operated in the portable computing devices. For example, the illuminator may be part of an assembly that, under normal operating conditions, maintains eye-safe operation by preventing a person from getting too close to the illuminator. However, in some cases, damage (e.g., cracks) to the optical structure that modifies the output beam for safe operation, or the presence of moisture or chemical contamination on the optical structure, may result in safety hazards. Likewise, if the optical structure were to become detached or removed, safety could be compromised.

SUMMARY

The present disclosure describes illuminator modules that, in some instances, have improved safety features.

For example, in one aspect, the disclosure describes an illuminator module that includes a light source disposed in a chamber of the module and operable to produce light for emission from the module. An optical component is disposed over the light source and is operable to modify an optical characteristic of the light produced by the light source. Multiple photodetectors are operable to detect light reflected by the optical component, and a controller is coupled to the light source and to the photodetectors. The controller is operable to monitor a distribution of the reflected light detected by the photodetectors, and to regulate an optical output power of the light source if it is determined, based on the monitored distribution of light, that an unsafe level of light may be emitted from the module.

Some implementations include one or more of the following features. For example, in some instances, the controller is operable to regulate the optical output power of the light source if the controller determines, based on the monitored distribution of the reflected light, that the optical component is detached from its proper position, is damaged and/or contains a defect. In some cases, regulating the optical output power of the light source includes turning off the optical output power. In some instances, the controller is operable to compare the monitored distribution of the reflected light to an expected distribution of the reflected light.

In some implementations, the optical component includes an optical diffuser. The photodetectors can be integrated into the same semiconductor die as the controller. Each of the photodetectors can be operable, for example, to detect a combined signal that represents a combination of light reflected by the optical component and ambient light. The module can include an ambient light subtraction circuit operable to subtract a signal representing the ambient light from the combined signal. Further, the controller can be operable to obtain outputs of the ambient light subtraction circuit, and to use the outputs to make a determination as to whether an unsafe level of light may be emitted from the module.

In another aspect, the present disclosure describes a method that includes producing, by a light source, light to be emitted from a module, detecting, by multiple photodetectors, light reflected by an optical component disposed over the light source, monitoring a distribution of the reflected light detected by the photodetectors, and regulating an optical output power of the light source if it is determined, based on the monitored distribution of light, that an unsafe level of light may be emitted from the module.

In some instances, the method includes regulating the optical output power of the light source if the controller determines, based on the monitored distribution of the reflected light, that the optical component is detached from its proper position, is damaged and/or contains a defect.

In yet another aspect, the disclosure describes an illuminator module that includes a light source disposed in a chamber of the module and operable to produce light for emission from the module. An optical component is disposed over the light source and is operable to modify an optical characteristic of the light produced by the light source. The module includes a photodetector operable to detect a combined signal that represents a combination of light reflected by the optical component and ambient light. An ambient light subtraction circuit is coupled to the photodetector and is operable to subtract a signal representing the ambient light from the combined signal. The module also includes a controller operable to obtain an output of the ambient light subtraction circuit, and to use the output to make a determination as to whether an unsafe level of light may be emitted from the module.

Some implementations provide one or more of the following advantages. For example, monitoring the reflected light distribution in the emitter chamber can help improve eye-safety. By sensing the light reflected by the diffuser or other optical component at multiple positions, a wider range of failures of the optical component can be detected, and appropriate action can be taken to mitigate safety hazards. The techniques described here can be used in the context of both direct and indirect time-of-flight measurements.

Other aspects, features and advantages will be readily apparent from the following detailed description, the accompanying drawings and the claims.

DETAILED DESCRIPTION

The present disclosure describes illuminator modules and techniques to facilitate detection of an abnormality that might cause an eye-safety hazard or other risk. In general, detection of the abnormality can be implemented by providing multiple photodetectors to sense light reflected by the optical component (e.g., an optical diffuser) through which the light produced by the light source is designed to pass before leaving the module. Output signals from the photodetectors can be monitored (e.g., by circuitry in the light source driver circuit) to determine a distribution of light reflected by the optical component. In appropriate circumstances (e.g., if the detected light distribution of light or a change in the light distribution indicates there may danger to eye or skin safety), the control circuitry can turn off or otherwise regulate (e.g., reduce) the optical power output of the light source.

Figure 1:
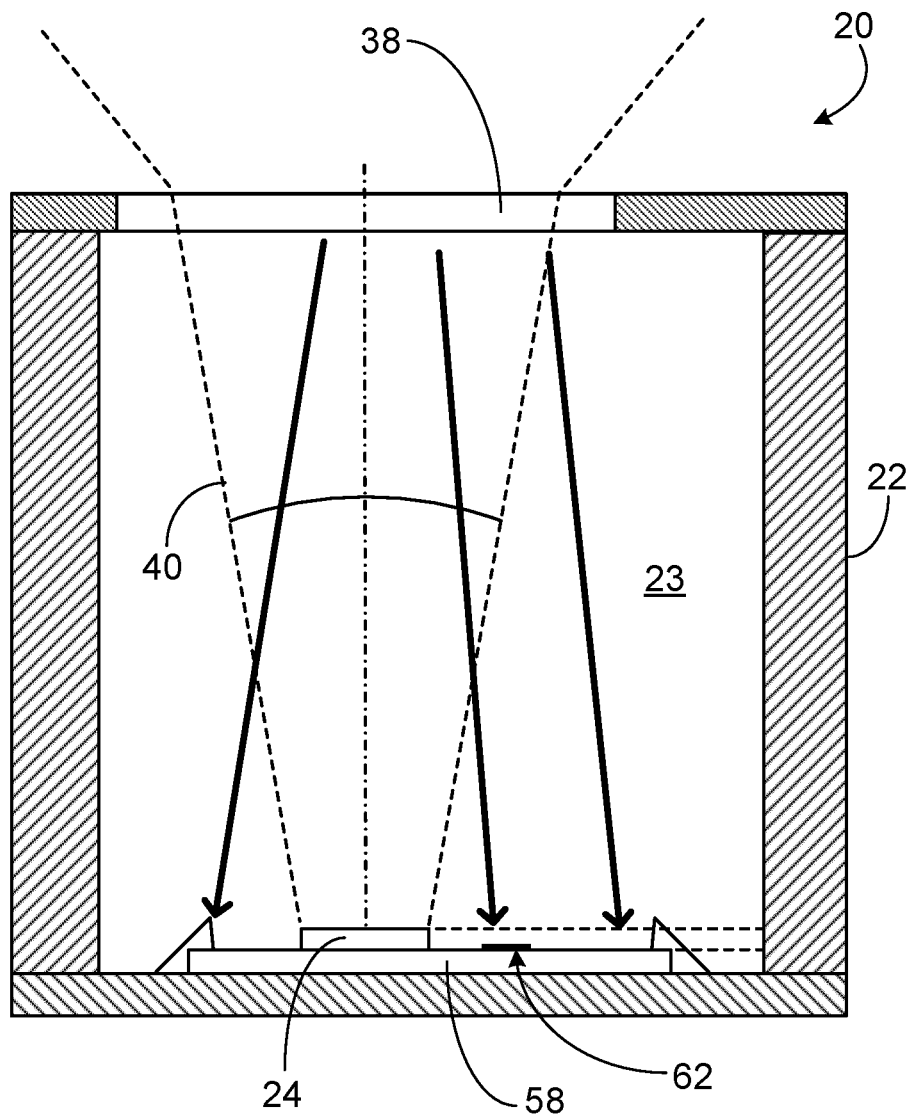
FIG. 1 is a cross-sectional view showing an example of an illuminator module.

FIG. 1 illustrates an example of an illuminator module 20 in accordance with the present disclosure. A molded package housing 22 has chamber 23 in which a light source 24 is mounted. In the following discussion, it is assumed that the light source 24 includes one or more VCSELs. In some implementations, the light source 24 includes an array of VCSELs or other types of laser diodes. In some instances, the light source 24 includes one or more light emitting diodes (LEDs), infra-red (IR) LEDs, organic LEDs (OLEDs), or infra-red (IR) lasers. The light source 24 is operable to produce light (e.g., infra-red or visible) for transmission from the module 20.

The module also houses a current driver controller 58, which can be implemented, for example, as an integrated circuit in the form of a semiconductor (e.g., silicon) chip. The controller 58 is operable to regulate the optical output power of the light source 24.

In some instances, the light source 24 is mounted on the current driver controller 58. The light source 24 can be connected electrically to the controller 58, e.g., using surface mount technology contact pads and/or wire bonding.

The housing 22 can include conductive feedthroughs with pads on the inside and pads on the outside for surface mount soldering the module to a printed circuit board (PCB) or other substrate.

An optical component 38 is disposed over the light source 24 so as to intersect the path of light beam(s) produced by the light source. The optical component 38 can include, for example, an optical diffuser, a lens, a microlens array, a refractive or diffractive optical element, a spectral filter, a polarizing filter, and/or some other optical structure operable to modify the optical characteristics of the VCSEL output beam(s) 40. The optical component 38 can be attached to the housing 22 or to a transparent cover glass.

The module also includes photodetectors 62, which in some cases are integrated into the same semiconductor (silicon) die as the controller 58. Such an arrangement can, in some instances, provide cost and/or area savings. The photodetectors 62 are operable to sense light reflected by the optical component 38 and can be implemented, for example, as photodiodes, PN photodiodes, PIN photodiodes, avalanche photodiodes (APDs) or SPAD-based photodetectors. In some cases, the photodetectors 62 are arranged in an array. Integrating the photodetectors 62 into the same semiconductor die as the controller circuitry also may provide better accuracy for sensing the reflected light.

In operation, most of the light produced by the light source 24 passes through the optical component 38 and exits the module. The light may be used for various applications (e.g., proximity sensing). An optical diffuser, for example, can be advantageous as the optical component to spread the light produced by the light source 24. The presence of such a diffuser can help ensure that only eye-safe levels of light are emitted from the module.

In some situations, however, the optical component 38 may become partially or completely detached, or may become damaged. Such situations could lead to an unsafe intensity of light being emitted from the module. The following paragraphs describe additional techniques to help avoid unsafe levels of light being emitted from the module.

Even when the optical component 38 is properly attached to the housing 22, some of the light produced by the light source 24 may be reflected back by the optical component 38 into the chamber 23 of the module. The light reflected by the optical component 38 can be used to determine whether there may be a potential problem with the optical component 38. In particular, the photodetectors 62 collectively can be used to detect the distribution of the reflected light. The photodetector outputs can be provided to, or read by, the controller 58, which monitors the detected distribution of light. If an anomaly is detected, the controller 58 can turn off or otherwise regulate the output power of the light source 24.

For example, when the light source 24 is operating properly and the optical component 38 is properly attached in place, the photodetectors can be expected to sense a particular distribution of light reflected by the optical component 38. This distribution of light can be stored (e.g., in memory associated with the controller 58) as a reference. On the other hand, if, for example, the optical component 38 becomes partially or completely detached from the housing, or if it becomes damaged or contains a defect (e.g., a crack, void or delamination), then the distribution of light detected by the photodetectors 62 will, in many cases, change. Depending on whether the optical component 38 is dislodged or damaged or contains some other defect, some or all of the photodetectors 62 may detect an increase or decrease in light intensity, or an unequal distribution of the reflected light. Further, the change in the level of light detected by different ones of the photodetectors 62 may differ from one another. Further, the level of light detected by some photodetectors 62 may increase, whereas the level detected by other photodetectors may decrease, and the level of yet other photodetectors may remain about the same.

Figure 2:
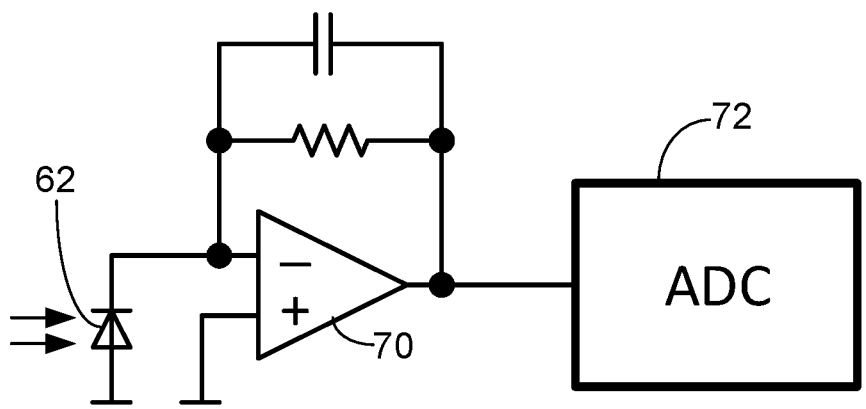
FIG. 2 is an example schematic of a monitoring circuit.

The semiconductor die for the driver controller 58 can include a monitoring circuit for the photodetector outputs. The monitoring circuit can be operable to amplify the signals from the photodetectors 62, integrate the signals, and process the signals. FIG. 2 shows an example of such a circuit, which includes an amplifier 70 having a pair of inputs (i.e., an inverting input and a non-inverting input), one of which receives the output signal from a photodetector 62. Although only one photodetector 62 is illustrated in FIG. 2, a multiplexer can be provided between outputs from multiple photodetectors 62 and the amplifier input so that the different photodetector outputs can be coupled to the amplifier one at time. A capacitor and resistor coupled between the input and output of the amplifier 70 provide an integrating function that can help average the received instantaneous values and reduce the effects of noise. The amplifier output is coupled to an analog-to-digital converter (ADC) 72, whose output is coupled to a digital control circuit in the drive controller 58.

Figure 3:
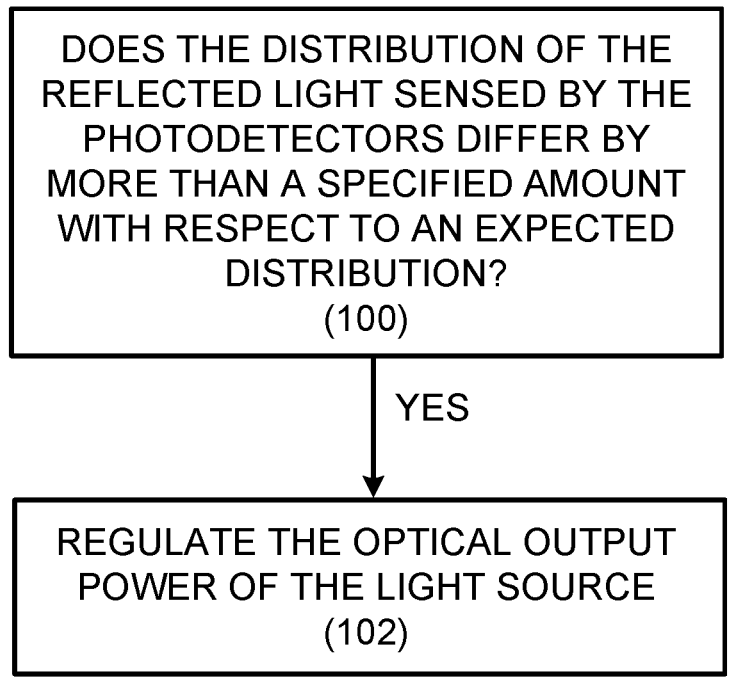
FIG. 3 is flow chart relating to control of the optical output of light source.

The controller 58 can accumulate the various output signals from the ADC 72 and can compare the distribution of values to the expected distribution. As indicated by FIG. 3, if the distribution of the reflected light differs by more than a specified amount with respect to the expected (i.e., reference) distribution (100), the controller 58 automatically can turn off or otherwise regulate (e.g., reduce) the optical output power of the light source 24 (102). In some cases, the ADC output may be coupled to an interface for the host device in which the module is disposed, rather than a digital control circuit in the drive controller 58. In such implementations, a controller in the host device would provide the foregoing operations (e.g., comparing the distribution of light levels detected by the photodetectors 62 to the expected distribution regulating the light source 24 in response).

Figure 4:
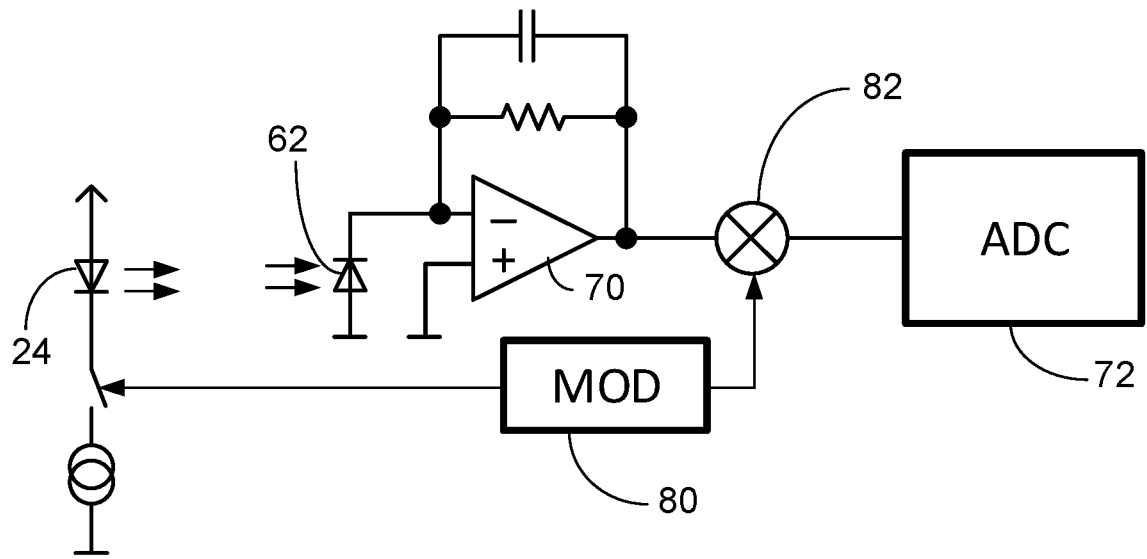
FIGS. 4 and 5 are example schematics of monitoring circuits operable to provide ambient light subtraction.
Figure 5:
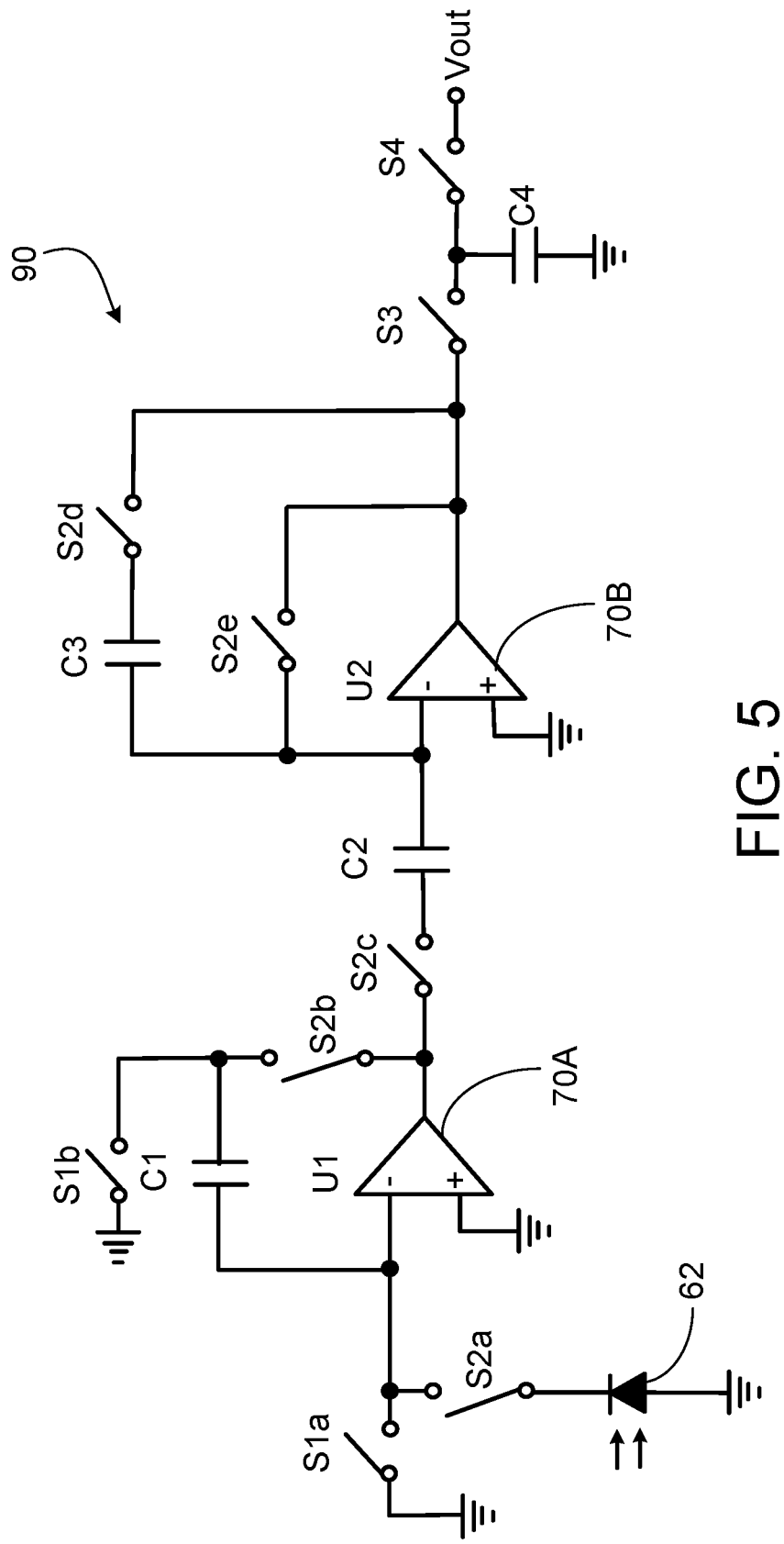

In some instances, as light reflected by the optical component 38 is sensed by the photodetectors 62, the photodetectors also may sense optical noise (e.g., ambient light passing into the module 20 through the optical component 38), which may adversely impact the optical measurements. FIGS. 4 and 5 illustrate a technique for reducing or eliminating the impact of such optical noise. As shown in FIG. 4, a modulator 80 can modulate the output of the light source 24 at a particular frequency, and can modulate the sign of an adder 82 at the output of the amplifier 70 at the same frequency. Thus, for example, photodetector integration cycles with a negative sign are introduced between cycles of time-of-flight signal capturing. During periods when the light source 24 is emitting light, the amplifier 70 (and associated integration circuitry) integrates both the light signal reflected by the optical component 38 as well as the ambient light signal. On the other hand, during periods when the light source 24 is not emitting light, the amplifier 70 integrates only the ambient light signal. By subtracting the signals at the output of the amplifier 70 from one another, a signal representing substantially only the light signal produced by the light source 24 and reflected by the optical component 38 can be provided to the ADC 72.

FIG. 5 illustrates further details of an example of an ambient light subtraction circuit 90 incorporating ambient light subtraction. The circuit 90 includes first and second amplifiers 70A, 70B, various capacitive elements C1, C2, C3, C4, and groups of switches including reset switches (S1a, S1b), integration switches (S2a S2b, S2c, S2d, S2e), a sample and hold switch S3, and an output switch S4 to couple the output to the ADC 72.

The digital control circuit in the drive controller 58 is operable to close the reset switches (S1a, S1b) so as to reset the circuit between integration cycles, and to close the integration switches (S2a S2b, S2c) during light integration periods. The digital control circuit in the drive controller 58 also operates the switches S2d, S2e to provide ambient light cancellation. Thus, when the switch S2d is open and the switch S2e is closed, the capacitor C4 stores a signal representing the sum of the reflected light signal and the ambient light signal. On the other hand, when the switch S2d is closed and the switch S2e is open, the ambient light signal is subtracted such that the capacitor C4 stores a signal representing substantially only the reflected light.

In some instances, an additional, short non-modulated measurement cycle can be provided to detect a failure in which the light source 24 is operating in a DC mode (i.e., a mode in which the light source 24 is continuously on).

Figure 6:
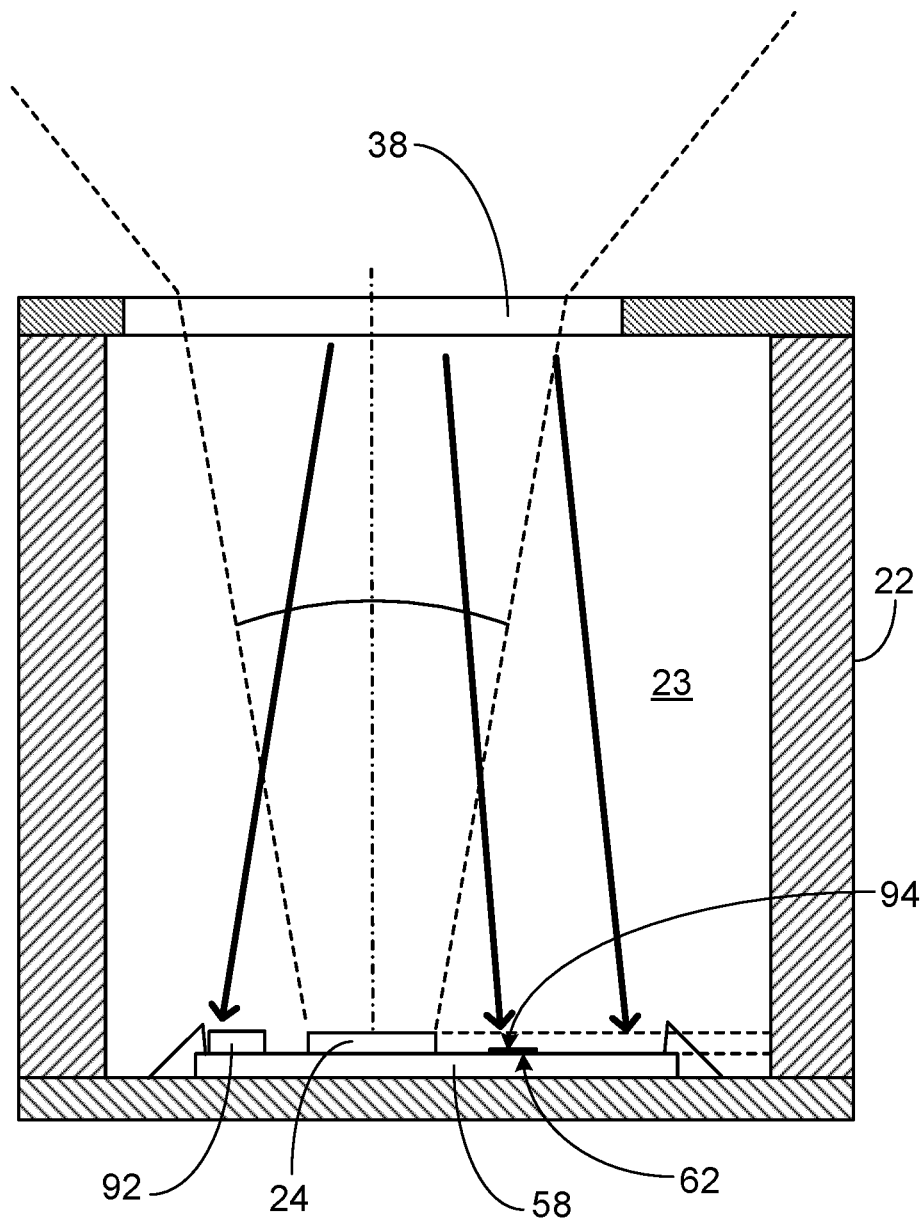
FIG. 6 is a cross-sectional view of another illuminator module.

As shown in FIG. 6, in some implementations, one or more temperature sensors 92 can be provided in the light emitter chamber 23. The temperature sensors 92 can, in some instances, be implemented in the same semiconductor chip as the photodetectors 62. The temperature sensor(s) 92 can be used to track fast changes in temperature that may indicate the optical component 38 is dislodged completely. The output of the sensor(s) 92 also can be coupled to the digital control circuit in the drive controller 58. If the control circuit determines that the sensed temperature is outside a pre-determined range, it can turn off or otherwise regulate the optical output of the light source 24.

As also shown in FIG. 6, in some cases, an optical band pass filter 94 can be provided over the photodetectors 62 to improve ambient light cancellation. The band pass filter 94 can be provided in combination with the modulated measurement technique described above or can be used separately. The presence of the band pass filter 94 can be particularly advantageous, for example, in environments where there is very strong sunlight.

The foregoing features can, in some instances, be used in combination with monitoring the optical produced by the light source 24 so as to keep the optical power as close to the permissible eye-safe limit as possible without exceeding the limit. In some cases, monitoring the light output can allow an increase in the power repetition rate so as to maintain particular performance standards with respect to temperature and/or the age of light source 24.

In some implementations, the housing 22 may include a second chamber (not shown) in which a light detector can be disposed to sense, e.g., light reflected by an object outside the module 20. Such an arrangement can be useful, for example, for proximity sensing as well as other applications.

The illuminator modules described above can be surface mount soldered to a printed circuit board used in a smart phone, tablet or other portable computing host device. In general, the foregoing modules can be used in a wide range of applications such as LIDAR, proximity sensing, 3D sensors and cameras, automotive sensing, and others.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

The invention claimed is:

1. An illuminator module comprising:
   a light source disposed in a chamber of the module and operable to produce light for emission from the module;
   an optical component disposed over the light source and operable to modify an optical characteristic of the light produced by the light source;
   one or more temperature sensors to track changes in temperature;
   a plurality of photodetectors operable to detect light reflected by the optical component;
   a controller coupled to the light source, and to the photodetectors and to the one or more temperature sensors, wherein the controller is operable to:
      monitor a distribution of the reflected light detected by the photodetectors;
      regulate an optical output power of the light source if it is determined, based on the monitored distribution of light, that an unsafe level of light may be emitted from the module; and
      regulate the optical output of the light source if the controller determines that the sensed temperature is outside a pre-determined range.

2. The illuminator module of claim 1, wherein the controller is operable to regulate the optical output power of the light source if the controller determines, based on the monitored distribution of the reflected light, that the optical component is detached from its proper position, is damaged and/or contains a defect.

3. The illuminator module of claim 1, wherein the controller is operable to turn off the optical output power of the light source if the controller determines, based on the monitored distribution of the reflected light, that the optical component is detached from its proper position, is damaged and/or contains a defect.

4. The illuminator module of claim 1, wherein the optical component includes an optical diffuser.

5. The illuminator module of claim 1, wherein the plurality of photodetectors are integrated into a same semiconductor die as the controller.

6. The illuminator module of claim 1, wherein the controller is operable to compare the monitored distribution of the reflected light to an expected distribution of the reflected light.

7. The illuminator module of claim 1, wherein each of the photodetectors is operable to detect a combined signal that represents a combination of light reflected by the optical component and ambient light, the module further including an ambient light subtraction circuit operable to subtract a signal representing the ambient light from the combined signal; optionally
   wherein the controller is operable to obtain outputs of the ambient light subtraction circuit, and to use the outputs to make a determination as to whether an unsafe level of light may be emitted from the module.

8. A method comprising:
   producing, by a light source, light to be emitted from a module;
   detecting, by a plurality of photodetectors, light reflected by an optical component disposed over the light source;
   detecting, by one or more temperature sensors, changes in temperature;
   monitoring a distribution of the reflected light detected by the photodetectors;
   regulating an optical output power of the light source if it is determined, based on the monitored distribution of light, that an unsafe level of light may be emitted from the module; and
   regulating an optical output power of the light source if it is determined that the sensed temperature is outside a pre-determined range.

9. The method of claim 8 including regulating the optical output power of the light source if the controller determines, based on the monitored distribution of the reflected light, that the optical component is detached from its proper position, is damaged and/or contains a defect.

10. The method of claim 8 including turning off the optical output power of the light source if the controller determines, based on the monitored distribution of the reflected light, that the optical component is detached from its proper position, is damaged and/or contains a defect.

11. The method of claim 8 including comparing the monitored distribution of the reflected light to an expected distribution of the reflected light.

12. The method of claim 8 including:
   detecting a combined signal that represents a combination of light reflected by the optical component and ambient light; and
   subtracting a signal representing the ambient light from the combined signal; optionally including:
   using a result of the subtracting to make a determination as to whether an unsafe level of light may be emitted from the module.

13. An illuminator module comprising:
   a light source disposed in a chamber of the module and operable to produce light for emission from the module;
   an optical component disposed over the light source and operable to modify an optical characteristic of the light produced by the light source;
   a photodetector operable to detect a combined signal that represents a combination of light reflected by the optical component and ambient light;
   an ambient light subtraction circuit coupled to the photodetector and operable to subtract a signal representing the ambient light from the combined signal;
   one or more temperature sensors to track changes in temperature;
   a controller operable to:
      obtain an output of the ambient light subtraction circuit, and to use the output to make a determination as to whether an unsafe level of light may be emitted from the module;
      regulate the optical output of the light source if the controller determines that the sensed temperature is outside a pre-determined range.

14. The illuminator module of claim 13, wherein the ambient light subtraction circuit is operable to integrate, during a first period, light reflected by the optical component and the ambient light, and to integrate, during a second period, only the ambient light.

15. The illuminator module of claim 13, wherein the controller is operable to regulate an optical output power of the light source if it is determined that an unsafe level of light may be emitted from the module.

16. The illuminator module of claim 13, wherein the controller is operable to turn off an optical output power of the light source if it is determined that an unsafe level of light may be emitted from the module.

17. The illuminator module of claim 13, wherein the controller is operable to turn off an optical output power of the light source if it is determined that the optical component is detached from its proper position, is damaged and/or contains a defect that may lead to unsafe level of light being emitted from the module.

18. The illuminator module of claim 13, wherein the one or more temperature sensors are implemented in a same semiconductor chip as the photodetector.

19. The illuminator module of claim 13 further including an optical band pass filter over the photodetector operable to provide ambient light cancellation.

* * * * *